United States Patent [19]

Anholm, Jr. et al.

[11] Patent Number: 5,043,655

[45] Date of Patent: Aug. 27, 1991

[54] CURRENT SENSING BUFFER FOR DIGITAL SIGNAL LINE TESTING

[75] Inventors: John M. Anholm, Jr., Snohomish; Gerald J. McMorrow, Kirkland, both of Wash.

[73] Assignee: John Fluke Mfg. Co., Inc., Everett, Wash.

[21] Appl. No.: 323,938

[22] Filed: Mar. 14, 1989

[51] Int. Cl.⁵ ............................................. G01R 31/00
[52] U.S. Cl. .................................. 324/73.1; 364/481; 361/87; 371/29.5
[58] Field of Search ........... 324/512, 522, 543, 158 R, 324/73.1; 371/29.5, 25.1; 364/481, 483; 330/257, 288; 361/87, 93; 323/315, 316

[56] References Cited

U.S. PATENT DOCUMENTS

| | | | |
|---|---|---|---|
| 4,122,358 | 10/1978 | Altmann | 371/20.1 |
| 4,255,748 | 3/1981 | Bartlett | 371/29.5 |
| 4,455,654 | 6/1984 | Bhaskar et al. | 371/22.6 |
| 4,514,845 | 4/1985 | Starr | 371/29.5 |
| 4,525,789 | 6/1985 | Kemper et al. | 330/279 |
| 4,600,811 | 7/1986 | Hayashi et al. | 379/405 |
| 4,695,961 | 9/1987 | Arinobu | 361/87 |
| 4,709,366 | 11/1987 | Scott et al. | 371/22.6 |
| 4,767,996 | 8/1988 | Jinzenji | 324/522 |
| 4,785,406 | 11/1988 | Lunderius et al. | 364/483 |
| 4,866,767 | 9/1989 | Tanimoto | 379/413 |
| 4,884,243 | 11/1989 | Johnston et al. | 365/64 |

OTHER PUBLICATIONS

"MOSFET's Mirror Current Cuts Power", *ELECTRONIC PRODUCTS*, Mar. 3, 1986, p. 64.
"IR Adds MOSFET's With Built-In Sensing", *EE TIMES*, Mar. 19, 1986.

*Primary Examiner*—Kenneth A. Wieder
*Assistant Examiner*—William J. Burns
*Attorney, Agent, or Firm*—Michael J. Strauss; Richard A. Koske

[57] ABSTRACT

A current sensing buffer 26 for driving a digital signal line of a unit under test 12 is composed of current mirror circuits in series with output switching transistors supplying test signals to the digital signal line. The current mirror circuits 66, 72 and 80, 84 generate sample currents corresponding to the magnitude of current through the respective drivers 68 and 78 to detect drive faults caused by bus or component failures. In buses comprised of several digital signal lines, one current sensing buffer 26 is used per line, and each curent sensing buffer 26 is controlled by a programmable circuit tester 10. The current sensing buffer 26 can be incorporated into an interface pod 14 which is substituted for a control component of a unit under test 12.

6 Claims, 5 Drawing Sheets

CURRENT SENSING BUFFER FOR DIGITAL SIGNAL LINE TESTING

FIELD OF THE INVENTION

This invention relates to electrical measurement apparatus and methods and, more particularly, to digital signal line and bus testers and methods therefor.

BACKGROUND OF THE INVENTION

As is well known to those skilled in the digital electronics arts, a microprocessor-based electronic system or assembly includes a microprocessor which functions as a central processing unit (CPU). The CPU is interconnected with other system components including random access and read only memory circuits (RAM's and ROM's) through various digital signal lines, frequently structured as system data and address buses, which carry streams of digitally-encoded data. Each such assembly includes one or more input/output (I/O) circuits which permit data to be coupled into and out of the microprocessor based system from a wide variety of input and output devices such as manually-operated keyboards and switches, information display devices, analog-to-digital converters, digital-to-analog converters, and various types of transducers and interfaces that provide signals representative of desired system stimuli and/or respond to an alarm or control signal provided by the microprocessor-based electronic system. As is also known to those skilled in the art, a microprocessor-based system or assembly often includes other types of digital circuit arrangements, such as buffer stages, decoding networks and variously-configured arrangements of logic gates.

Since microprocessor-based systems have fewer components than comparable circuits employing discrete logic elements arranged to exhibit the same or similar operational capabilities as the microprocessor based systems, and since microprocessor-based systems can be manufactured at relatively low cost, the use of such systems has grown dramatically. This growth continues as new microprocessor-based products are developed and as new microprocessor circuits and associated memory devices of increased signal-processing capability become available. In this regard, the use of microprocessor-based systems has not been limited to replacements for electronic systems and assemblies that were previously realized by relatively complex arrangements of discrete logic circuitry but has resulted in a wide variety of new products including small computers for business and home use and electronic games. Moreover, since microprocessor-based arrangements are reliable and can be manufactured at a relatively low cost, such circuits and system are rapidly replacing electromechanical arrangements such as, for example, the control and timer assemblies used in home appliances, the electromechanical arrangements of pinball and various gaming machines, and the electromechanical computing and tabulation assemblies utilized within cash registers, typewriters and other business machines.

Although microprocessor-based systems and assemblies have numerous advantages from the standpoint of both the manufacturer and the system user, such systems exhibit certain disadvantages and drawbacks relative to the testing and troubleshooting that are necessary to maintain satisfactory quality control during the manufacturing process and to maintain and repair such a system once it has been placed in service. In this regard, since the system primarily consists of integrated circuits that are interconnected with one another by means of digital signal lines often configured in a system bus architecture, relatively few test points are available. Moreover, very few system failures can be detected by testing relatively static signal conditions within the system. Satisfactory testing and troubleshooting require the detection of system control, status, addressing and data signals which appear on the digital signal lines, and on the digital signal lines of the system bus as a rapidly changing series or string of digitally-encoded data words. Since the digital signal lines of the system bus are typically bidirectional, with data signals being coupled to and from various system components, use of traditional testing concepts, which involve stimulating a device in a controlled manner and monitoring the response thereto, becomes a relatively complex task.

Accordingly, apparatus which permits an operator to access and examine various signals in a microprocessor-based assembly or system has not satisfied the need for test equipment which can be used in a wide variety of situations ranging from manufacturing tests of electronic assemblies and subassemblies to field service and repair of completed units. For example, to facilitate the design of microprocessor-based electronic assemblies and systems, microprocessor manufacturers and others have developed relatively complex apparatus generally known as microprocessor development systems which permit an operator to interact with a microprocessor system by, for example, selectively establishing address and control signals as well as the value of ROM-stored signals as he or she sequentially steps through the microprocessor logic sequence or program. Moreover, most microprocessor development systems allow the operator to store a sequence of digitally-encoded signals that appear on the digital signal lines of the system bus between any two specific system states such as selected address signals, specified system command signals or specified states of the system data bus. The stored information can then be examined to locate programming faults.

Although microprocessor development systems provide substantial assistance in designing microprocessor-based systems by allowing the system designer to establish, evaluate and debug the system programming, such apparatus is of little use in manufacturing and field service environments since hardware-related faults and failures are not located. Moreover, satisfactory operation of such equipment requires an in-depth understanding of the manner in whic.\* the microprocessor-based system or the unit under test (UUT) is programmed and sequenced and requires substantial training and experience in the design and analysis of programmed apparatus.

To extend the capabilities of microprocessor development systems so as to permit detection and isolation of hardware-related faults and failures, such systems have been combined with "in-circuit emulation" techniques wherein the test arrangement is configured to replace the microprocessor circuit of the assembly being tested, i.e., the UUT. Interconnected in this manner, the test arrangement operates in conjunction with the UUT to execute diagnostic routines or programs that are organized to detect faults and, in many cases, to isolate the fault to a particular component or group of components. The instructions and data utilized in these diagnostic tests are generally stored in the memory of the microprocessor development system, and are coupled to the digital signal lines of the microprocessor bus during the in-circuit emulation routine. Examples of such in circuit testers are contained in Bhaskar et al., U.S. Pat. No. 4,455,654 and Scott et al., U.S. Pat. No. 4,709,366, both commonly assigned with the instant application.

To facilitate use with various types of microprocessor circuits, the microprocessor development system is configured so that the microprocessor circuit and associated memory devices, interface circuits and other digital logic circuits which must be configured for testing a specific UUT are provided in an interface pod. With this configuration, the interface pod is interchangeable and a system or assembly that employs a particular type of microprocessor is tested by connecting an appropriately configured interface pod to a general purpose circuit tester or development system. The interface pod is then connected to the UUT by means of an interface pod cable assembly including a connector which mates with the microprocessor socket of the UUT.

In operation, the interface pod is controlled by a circuit tester to simulate the signals normally generated by the microprocessor and to exercise and control other components of the UUT connected to the various signal lines including those comprising any system buses. The interface pod also detects signals on various digital signal lines of the bus to be received by the microprocessor. The detected signals are checked by the circuit tester for proper signal level, timing, etc.

If the interconnections between the interface pod and the other components connected to the digital signal lines of the UUT are faulty or inoperative because of a signal line fault, the interface pod may not be able to exercise the components over the signal line or may receive erroneous signals from the components because of the signal line fault rather than due to a component or software fault. To account for the possibility of a signal line fault prior to initiating system logic testing, as a first step in the testing process the circuit tester exercises or "wiggles" the signal lines, including those comprising any system data and address buses, which are normally controlled by the microprocessor. Each signal line is driven with predetermined logic level signals and the resultant voltage level on the signal line is monitored to determine if all signal lines are being properly driven. If the circuit tester detects an abnormal logic level, this indicates a short-circuit or open-circuit condition on the respective signal line(s). If the interface pod is not able to drive the appropriate signal lines to the desired logic level, it is not possible to control and test the other components over that signal line. During subsequent steps of the testing process the circuit tester continues to monitor signal line loading to detect drive faults not identified during the initial testing step.

In digital signal line testers of the prior art, a resistor is placed between each of the interface pod output drivers and the corresponding interface pod output terminal connected to the UUT which are in turn connected to the digital signal lines of the UUT. The voltage across the resistor is monitored to detect whether the logic level on the interface pod output terminal matches the logic level on the driver side of the resistor. If the voltage drop detected across the series resistor exceeds a predetermined value, a drive fault is deemed to exist.

Drive faults can be caused by various circuit abnormalities including a short-circuit or faulty component driving the signal line, e.g., short-circuit to ground, to a high logic level source, or to other signal lines. A drive fault can also be caused by two logic devices simultaneously driving a signal line, for example the tester and a device on the UUT, resulting in a collision. In this situation, driver fighting driver, the series resistor method will not always detect the fault. This is because the voltage drop across the series resistor depends on which driver is "stronger", i.e., supplies the greater current to the signal line.

Use of a series resistor to detect signal line driving faults also limits the maximum speed of the tester. This is because the series resistor together with capacitive loads of and on the signal line form an RC circuit, degrading the rise and fall time characteristics of the test signals and limiting the usable digital test signal frequency. The resultant RC circuit further has the disadvantage of increasing the propagation delay time between the interface pod and the UUT. To mitigate this problem, series resistance values are kept to a minimum, resulting in reduced voltage drops across the series resistors. The reduced voltage requires additional amplification to detect a drive fault while resulting in some errors going undetected because of reduced sensitivity.

A need therefore exists for a digital signal line fault detecting buffer capable of supplying a test signal to a UUT without degrading the test signal rise and fall time characteristics.

A need further exists for a digital signal line fault detecting buffer capable of operating at high digital frequencies.

A need still further exists for a digital signal line fault detecting buffer which introduces a minimum propagation delay between a circuit tester and a signal line of a UUT.

A need further exists for a digital signal line fault buffer for a circuit tester which precisely senses the amount of current required to drive a UUT.

A need still further exists for a digital signal line fault detecting buffer which reduces the amount of resistance placed in line with the bus.

Accordingly, an object of the invention is to provide a current sensing buffer for digital signal lines including bus testing applications capable of supplying test signals to a UUT without degrading test signal rise and fall time characteristics.

A further object of the invention is to provide a digital signal line buffer capable of supplying high frequency digital test signals to a UUT.

Another object of the invention is to provide a current sensing buffer which minimizes test signal propagation delays.

Still another object of the invention is to provide a current sensing buffer with enhanced drive fault detection capabilities.

Still a further object of the invention is to provide a digital signal line tester output buffer having a low output impedance.

SUMMARY OF THE INVENTION

In accordance with one aspect of the invention, a current sensing buffer for use in testing digital signal lines includes an excitation or "state switching" circuit for generating test signals for injection into a UUT. A current mirror circuit supplies the test signals from the state switching circuit to the signal line and measures corresponding current levels. A fault detection circuit compares the current levels measured by the current sensing circuit to detect signal levels indicating a fault condition. If the sensed value exceeds a threshold level, an error signal is generated.

According to another aspect of the invention, the state switching circuit includes a circuit for generating the predetermined logic levels to be supplied to the signal line of the UUT.

According to still another aspect of the invention, the interface pod included a tri-stating protection circuit for controlling the state switching circuit. In a normal mode of operation the state switching circuit generates the predetermined logic levels and in a tri-state mode causes the buffer output to present a high impedance output to the signal line of the UUT.

Still other objects and advantages of the present invention will become readily apparent to those skilled in this art from the following detailed description, wherein only the preferred embodiment of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

DESCRIPTION OF THE PREFERRED EMBODIMENT

Figure 1:
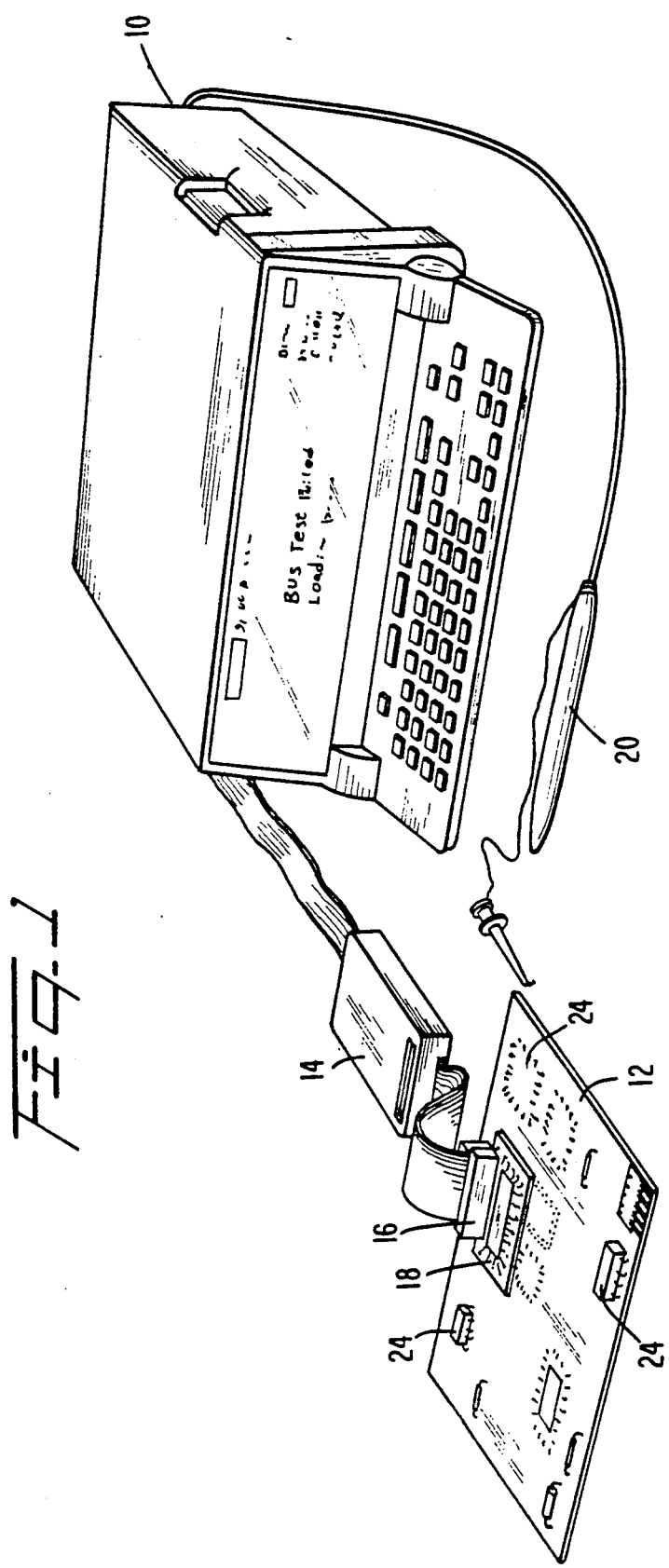
FIG. 1 is a perspective view of a circuit tester connected to a unit under test (UUT) through an interface pod circuit incorporating signal line buffers according to the invention.

With reference to FIG. 1, a circuit tester 10 is connected through pod interface 14 to a unit under test (UUT) 12 to locate circuit faults caused by signal line defects, defective UUT components 24, etc. Interface pod 14 includes a current sensing buffer circuit for each signal line to be tested and monitored for drive faults. Circuit tester 10 is a conventional system for testing microprocessor-based circuit boards. An exemplary system is a type 9010A or 9100A Micro-System troubleshooter manufactured by John Fluke Mfg. Co., Inc., Everett Wash.

Pod interface 14 simulates the UUT based microprocessor and monitors the performance of the UUT to identify defective circuit functions caused by signal line faults, bus faults and/or other hardware failures under the control of tester 10. Pod 14 is coupled to UUT 12 by connection to the microprocessor or to the microprocessor-socket 18 through connector 16 with microprocessor removed. A keyboard is included for manual entry of data and a display enables a technician to view test results. Circuit tester 10 further includes sufficient memory to store programs and data base files to control pod interface 14 to supply appropriate stimulus tests to the UUT, making response measurements and interpreting the results to classify the UUT as "good", i.e., fully operational, or "bad" and identifying the source of the failure.

The circuit tester 10 may further include a manual probe 20 which is operated by the technician who probes the UUT node by node, while the tester exercises the UUT circuitry. Probe 20 also includes a current sensing buffer for measuring drive currents and detecting drive faults.

Figure 2:
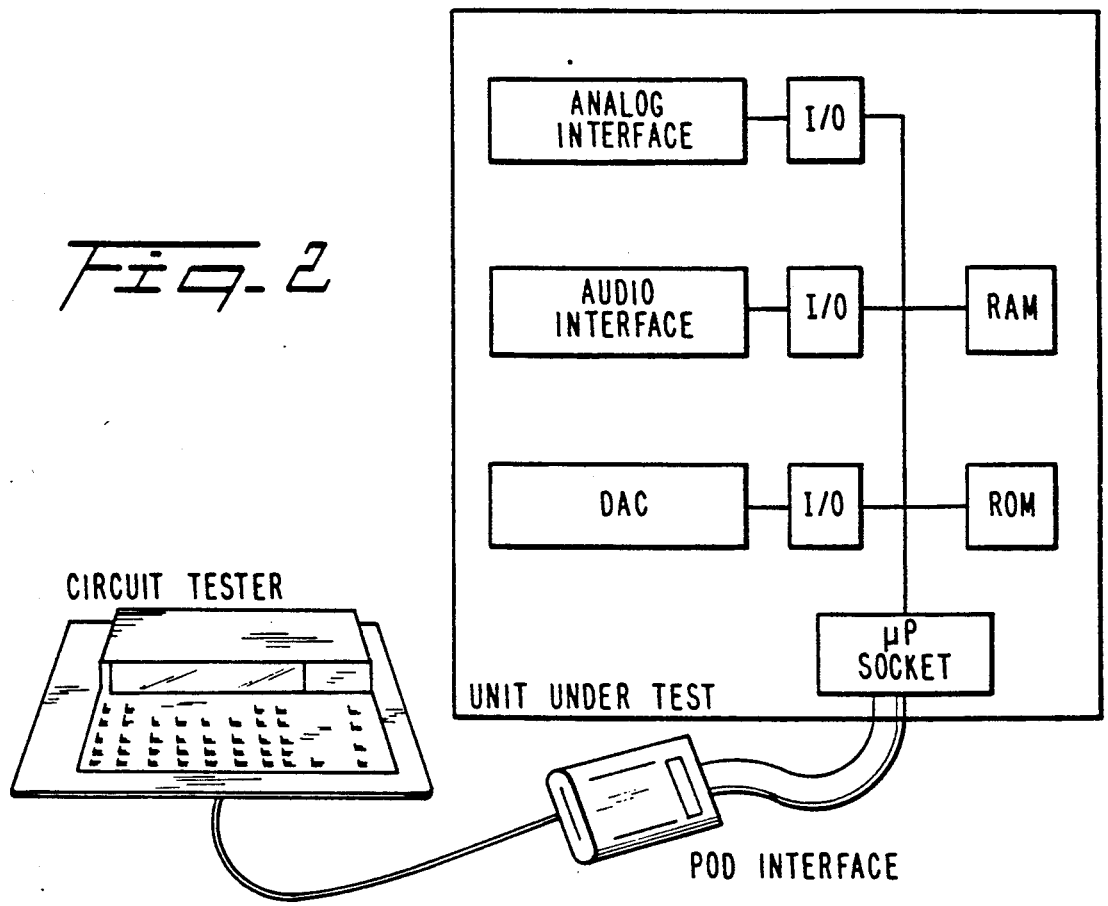
FIG. 2 is a diagram showing how a circuit tester is connected to the components of a UUT through an interface pod.

FIG. 2 shows circuit tester 10 connected to control pod interface 14 for generating and monitoring digital signals of a UUT. Pod 14 provides stimulus signals to components 24 of UUT 12 through microprocessor socket 18 and the digital signal lines of UUT system bus 22. Bus 22 typically includes a plurality of signal lines for parallel transmission of data, address, and/or control signals.

Figure 3:
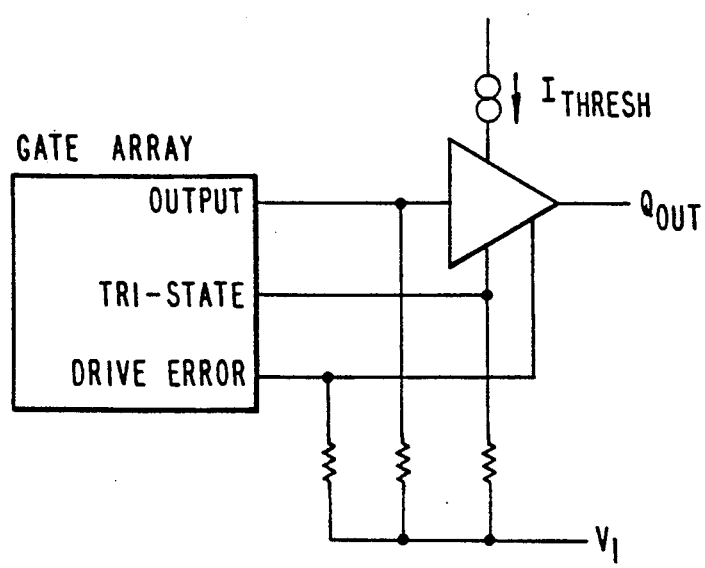
FIG. 3 is a block diagram showing how the current sensing buffer is connected to a test controller for testing faults in a UUT.

FIG. 3 shows further details of interface pod 14 which includes current sensing buffer 26 having a current mirror circuitry for detecting bus drive faults. Similar circuitry may also be included in manual probe 20. As will be discussed in more detail below, the current mirror comprises two matched transistors, typically with one transistor being a physically scaled replica of the other so that current flowing through the first transistor results in a corresponding scaled current flow in the second transistor. By driving a signal line through one half of a current mirror, the driving current is sensed and measured through the other half. While prior art bus testers detect drive current by measuring a voltage across a resistor of 30–100 ohms in series with the buffer output, the current mirror has an effective resistance on the order of several ohms.

Current sensing buffer 26 includes a tri-state control input 28 for controlling the state of an output terminal 30, to assume a high impedance state. Output terminal 30 is connected to the UUT and the UUT signal lines through connector 16. Although only a single current sensing buffer 26 is shown, one current sensing buffer per signal line of the UUT bus is preferably provided to test and exercise all the lines of a multi-line bus in parallel.

Another output terminal 32 provides an output signal in response to an instantaneous excess drive current from the buffer at terminal 30. An external current input 34 sets the threshold of the output drive current which determines at what load current an error in the bus is deemed to exist, as shall be described in more detail below. Data Input 36 is provided with a signal from gate array 40 for controlling output 30 of current sensing buffer 26.

Figure 4:
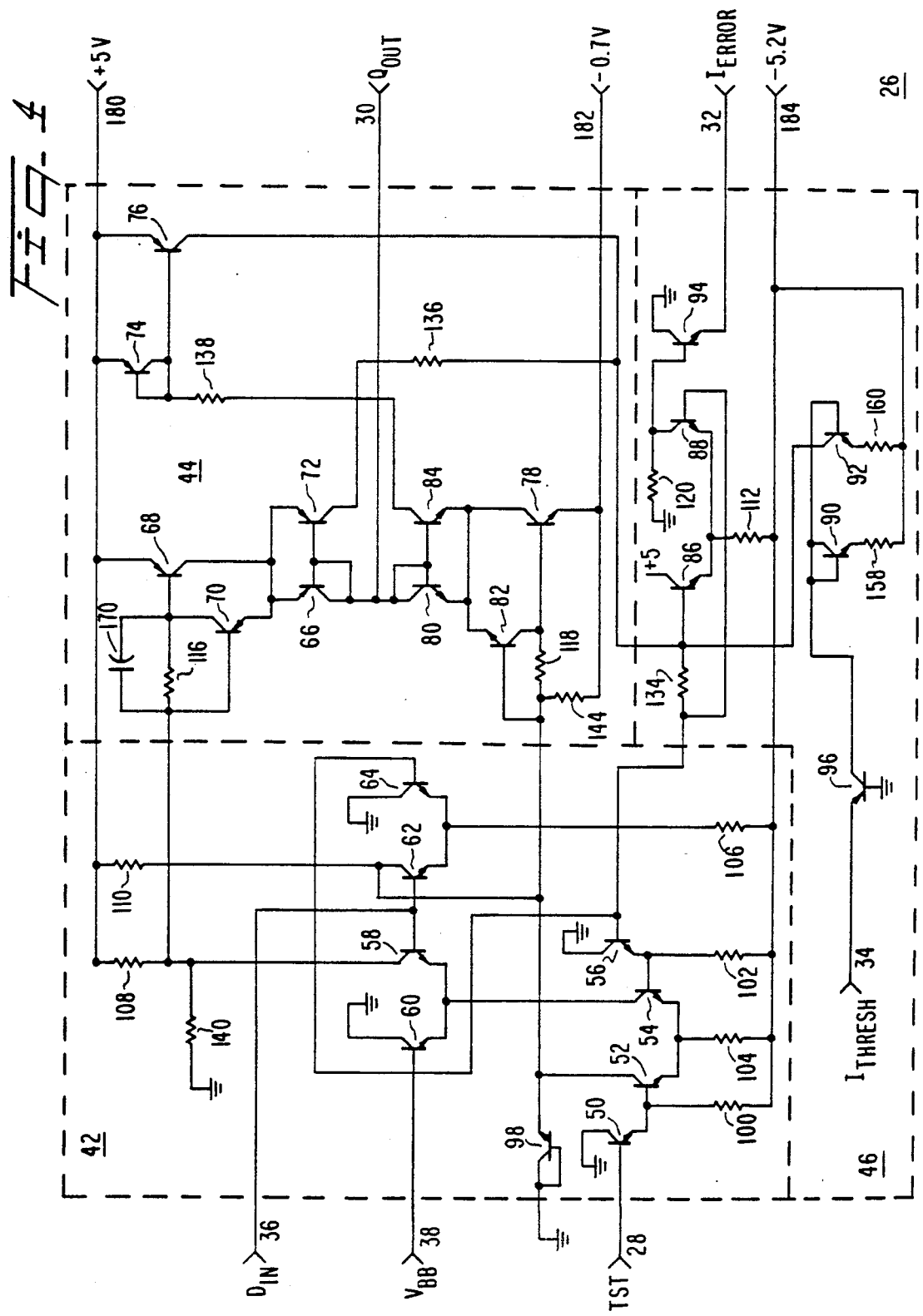
FIG. 4 is a schematic diagram showing circuit details of the current sensing buffer of the invention.

Referring to FIG. 4, current sensing buffer 26 comprises three principal functional blocks, i.e. (1) an ECL (emitter coupled logic level) data input and tri-state control 42, (2) a TTL (transistor-to-transistor logic level) output and current sense portion 44 controlled by control portion 42, and (3) threshold programming and comparator circuitry 46.

Data input and tri-state control portion 42 receives an input data signal from circuit tester 10 via gate array 40 at input terminal 36 to control buffer output at terminal 30. The tri-state control portion disables input terminal 36 in response to a tri-state command signal from circuit tester 10 via gate array 40, forcing output 30 to a high impedance state, neither supplying current to, nor sinking current from, the UUT. Finally, input terminal 38 receives an ECL reference voltage, typically minus 1.5 volts dc, input signals having a more positive voltage (e.g. −1 volt) being interpreted as an ECL logic high input, while signals having a more negative value (e.g. −2 volts) are interpreted as an ECL logic low input.

Output and current sensing portion 44 selectively sources current to, and sinks current from, the UUT via output terminal 30 under the control of data input and tri-state control portion 42. Alternatively, when neither supplying nor sinking current at output terminal 30, portion 44 presents a high impedance tri-state output at output terminal 30. Current levels to and from the UUT through output terminal 30 are sampled using current mirror circuits. The scaled sample signal is supplied to threshold programming and comparator circuitry 46 which compares the scaled current sample with a threshold current input from terminal 34. If the sample signal level exceeds the threshold signal level, an overload error signal is output through gate array 40 to circuit tester 10 from output terminal 32. The overload error signal is used to detect drive faults and to protect the buffer from sustained overload conditions with gate array 40 in pod interface 14 causing output 30 to enter the high impedance tri-state mode.

Tri-state control includes transistors 50, 52, 54 and 56, with the base of transistor 50 connected to tri-state input terminal 28. The collector of transistor 50 is grounded while the emitter is connected to the base of transistor 52 and through emitter resistor 100 to $V_{EE}$. As shown in FIG. 4, $V_{EE}$ is optimally −5.2 volts. The collector of transistor 52 is connected to (1) the emitter of transistor 98, the latter having its base and collector terminals grounded, (2) to the base of current sinking transistor 78 through base resistor 118, and (3) to $V_{CC}$ (+5 volts) through collector resistor 110. The emitter of transistor 52 is connected to the emitter of transistor 54 and to $V_{EE}$ through emitter resistor 104.

Tri-state transistors 54 and 56 are turned off to disable the data input circuitry, the collector of 54 connected in common to the emitters of input transistors 58 and 60. The base of transistor 54 is connected to the emitter of transistor 56 and to $V_{EE}$ through resistor 102, the collector of transistor 56 grounded. The base of transistor 56 is connected to ECL reference level input terminal 44 which is supplied with reference potential $V_{BB}$ of optimally −1.5 volts.

The data input circuitry of the buffer includes transistors 58, 60, 62 and 64. The input stage is used to receive and level shift the ECL data input, $D_{in}$, for the following TTL stage. When $D_{in}$ at terminal 36 is an ECL high logic level relative to threshold voltage $V_{BB}$ applied to terminal 38, transistor 58 draws sufficient current through resistor 108 to turn on the high state output device transistor 68, while transistor 62 draws enough current through resistor 110 to turn off transistor 78. When $D_{in}$ is an ECL low logic level, transistors 58 and 62 stop conducting and transistor 78 is turned on.

Data input is supplied from gate array 40 to input terminal 36 which is connected to the bases of input transistors 58 and 62, the collectors of which are connected to $V_{CC}$ through resistors 108 and 110, respectively. The collector of transistor 58 is also connected to the base of output transistor 68 through the parallel combination of capacitor 170 and resistor 116 to selectively provide a high output TTL level (+5 volts) at output terminal 30. Transistor 62 has its collector connected to the collector of tri-stating transistor 52 to disable transistor 62 in response to a tri-state command signal. Transistors 60 and 64 are configured with grounded collectors and ECL reference level $V_{BB}$ supplied to the bases of each. The emitters of transistors 60 and 64 are connected to the emitters of transistors 58 and 62, respectively.

Operationally, when input terminal 28 receives an external ECL signal, TST, the tri-state control circuitry disables both output transistors 68 and 78. When TST is an ECL high (−1 volt), transistor 54 stops conducting and input transistors 58 and 60 are disabled. This allows resistor 108 to raise the base of transistor 68 to a level high enough to turn transistor 68 off. Transistor 52 then draws sufficient current from resistor 110 to maintain transistor 78 turned off. Thus, output 30 presents a high impedance at buffer output terminal 30 to the UUT digital signal line. The tri-state mode is entered from pod 14 under the control of gate array 40 as part of the emulation sequence or after a predetermined overload condition is sensed from $I_{error}$ output terminal 32. Tri-stating output 30 avoids possible damage to the buffer circuits and to the other components of the UUT. The current sensing buffer can be taken out of the tri-state mode and made operational either periodically to check for continuation of the drive fault or upon initiation of a new testing routine by the controller.

The output stage includes high (source) and low (sink) state switching transistors 68 and 78, respectively, in series with current mirror transistor circuits 66, 72 and 80, 84, respectively. Transistor 68 provides high state (+5 volts) source current and transistor 78 provides the low state (ground) sink current for the TTL output 30, $Q_{out}$. To keep these devices from saturating, clamping transistors 70 and 82 are used to divert excess base current and thus increase switching speed. In order to sense the current through each of the collectors of transistors 68 and 78 to output 30, current mirrors are inserted in series between the collectors of transistors 68 and 78, respectively, and output 30, $Q_{out}$. Transistor 66, in series with transistor 68, forms one part of a current mirror with transistor 72 for sensing source current. Similarly, transistor 80 and 84 form a current mirror which senses sink current. The mirrored sink current is scaled by another current mirror, 74 and 76. The low state mirror current from transistor 76 is summed with the high state mirror current from transistor 72 and resulting sum current is provided to the following comparator and threshold programming stage 46. To force the output to a valid TTL low state, i.e. less than 0.4 volt, a virtual ground potential of −0.7 volt is supplied to the emitter of transistor 78.

The emitter of transistor 68 is connected directly to $V_{CC}$ with its base connected to, and controlled by, the collector of input transistor 58 through capacitor 170 and resistor 116, as previously detailed. Transistor 70 increases switching speed of transistor 68 and has its base connected to the collector of 58, and its collector connected to the base of transistor 68. The collector of transistor 68 is connected to the emitter of transistors 70, 66 and 72, with transistor 66 and mirror transistor 72 comprising a current mirror circuit. Thus, the base and collector of transistor 66 are connected to output terminal 30. Because the bases and emitters, respectively of mirror transistors 72 and 66 are connected together, the current through transistor 72 is proportional to the output current flowing through transistor 66. The mirror current, being a fractional portion of the supplied output current through transistor 66, is supplied by the collector of transistor 72 to the base of comparator circuit transistor 86 through resistor 136.

Output sink transistor 78 is controlled by transistors 52 and 62, the base of transistor 78 connected through resistor 118 to the collectors of transistors 52 and 62. The emitter of transistor 78 is connected to −0.7 volt rather than to ground to compensate for the nominal collector-to-emitter voltage drop through transistors 78 and 80. Clamping transistor 82 has its collector connected to the base of transistor 78 and its emitter connected to the collector of transistor 78 and to the emitters of transistors 80 and 84. The base of clamping transistor 82 is connected to the collectors of transistors 52 and 62 and to resistor 144, the other end of which is connected to −0.7 volt. Transistors 80 and 84 form a current mirror circuit for measuring the sink current flowing from $Q_{out}$ terminal 30 through transistor 78, transistor 80 having its base and collector connected to output terminal 36. Transistor 84 mirrors the current flowing through transistor 80 and supplies a scaled current through resistor 138 to a current mirror circuit comprising transistors 74 and 76. The latter current mirror circuit further scales the mirrored current signal, the collector of transistor 76 supplying a mirror current output to the base of comparator circuit transistor 86.

The threshold programming and comparator circuit 46 includes transistor 86 which has its base connected to a node comprising (1) the mirrored source current from 72, (2) the mirrored sink current from mirror circuit transistor 76, (3) an offset threshold current developed through threshold control transistor 92, and (4) $V_{BB}$ through resistor 134. The collector of transistor 86 is connected to $V_{CC}$ while the emitter thereof is connected together with the emitter of transistor 88 to $V_{EE}$ through resistor 112. The base of transistor 88 is connected to $V_{BB}$, and the collector of transistor 88 is connected to the base of ECL error output transistor 94 and to ground through resistor 120. The collector of transistor 94 is connected to ground, while the emitter supplies an ECL level error signal to output terminal 32.

A threshold current is input from circuitry in pod 14 under control of circuit tester 10 to input terminal 34 which is connected to the emitter of transistor 96. The base of transistor 96 is grounded while the collector is connected to the bases of transistors 90 and 92 and to the collector of transistor 90. Transistors 90 and 92 form a current mirror for scaling the input threshold current, the emitters of both connected to $V_{EE}$ through resistors 158 and 160, respectively.

Programming the threshold current, $I_{thresh}$, for the current magnitude at which an error signal is generated is accomplished by supplying a current with the range of, e.g. 0-1.0 mA to the emitter of transistor 96. This current is scaled by transistors 90 and 92 and is supplied to the base of transistor 86 as an offset current to the error current supplied to the same node by transistors 72 and 76. When the error current exceeds the programmed threshold current, the comparator circuit indicates an error condition. Transistors 86 and 94 then turn on and the ECL output signal $I_{error}$ is output at terminal 32.

Figure 5:
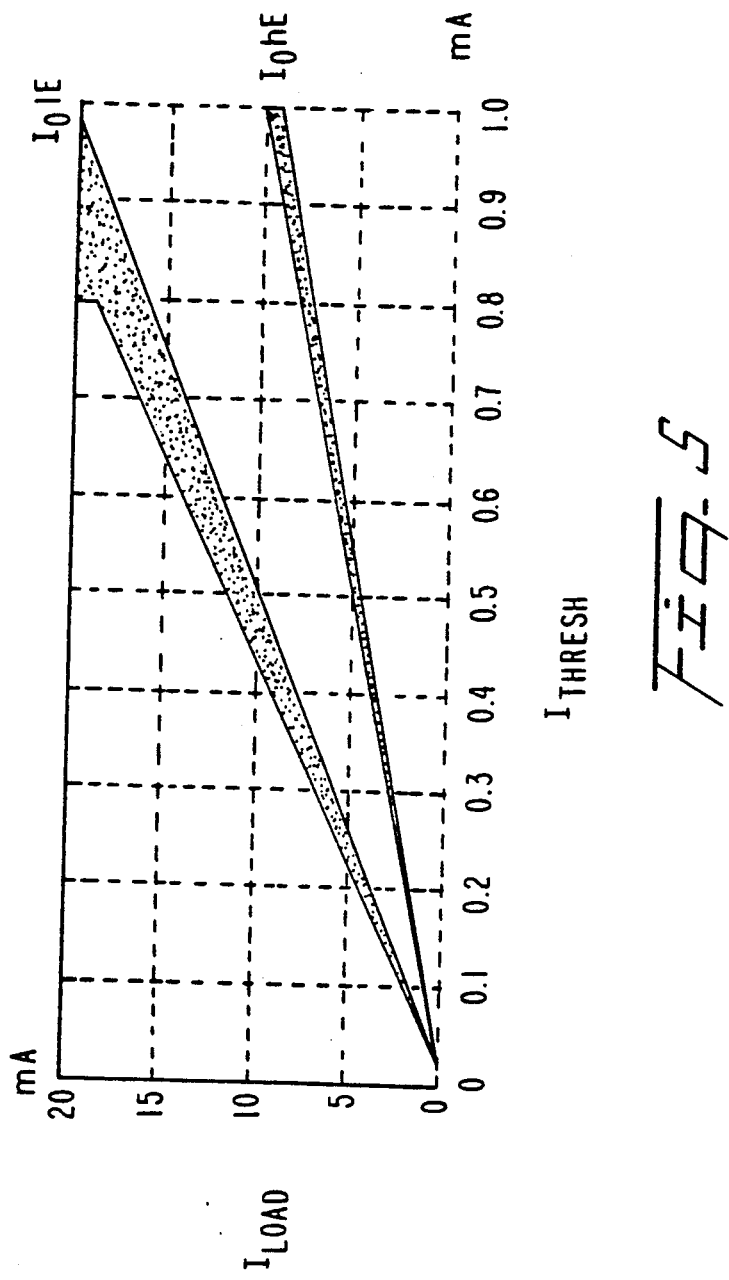
FIG. 5 is a graph relating overload bus driving current to programmed threshold current for defining the level of an error threshold.

The graph of FIG. 5 shows the relationship between the error currents, $I_{load}$ and $I_{thresh}$, with particular scaling provided by the current mirrors shown in FIG. 4. The hatched area of the graph represents a condition of uncertain circuit operation. Because the scaling factors between the mirror circuit source current ($I_{oh}E$) differ from those of the sink current ($I_{ol}E$), a given $I_{thresh}$ input current causes the current sensing buffer to have a sink current approximately twice that of a corresponding source current before after $I_{error}$ is asserted. This is useful where maximum sink and source current limits are related by a constant factor and allows more precise determination of errors. For example, an $I_{thresh}$ of 0.5 mA input to terminal 34 results in an error signal output at terminal 32 in response to the buffer 26 sourcing a current of more than 5 mA or sinking a current of greater than 12 mA at output terminal 30. Of course, other ratios between $I_{oh}E$ and $I_{ol}E$ are possible by proper selection of mirror ratios between source and sink mirror circuits.

Figure 6:
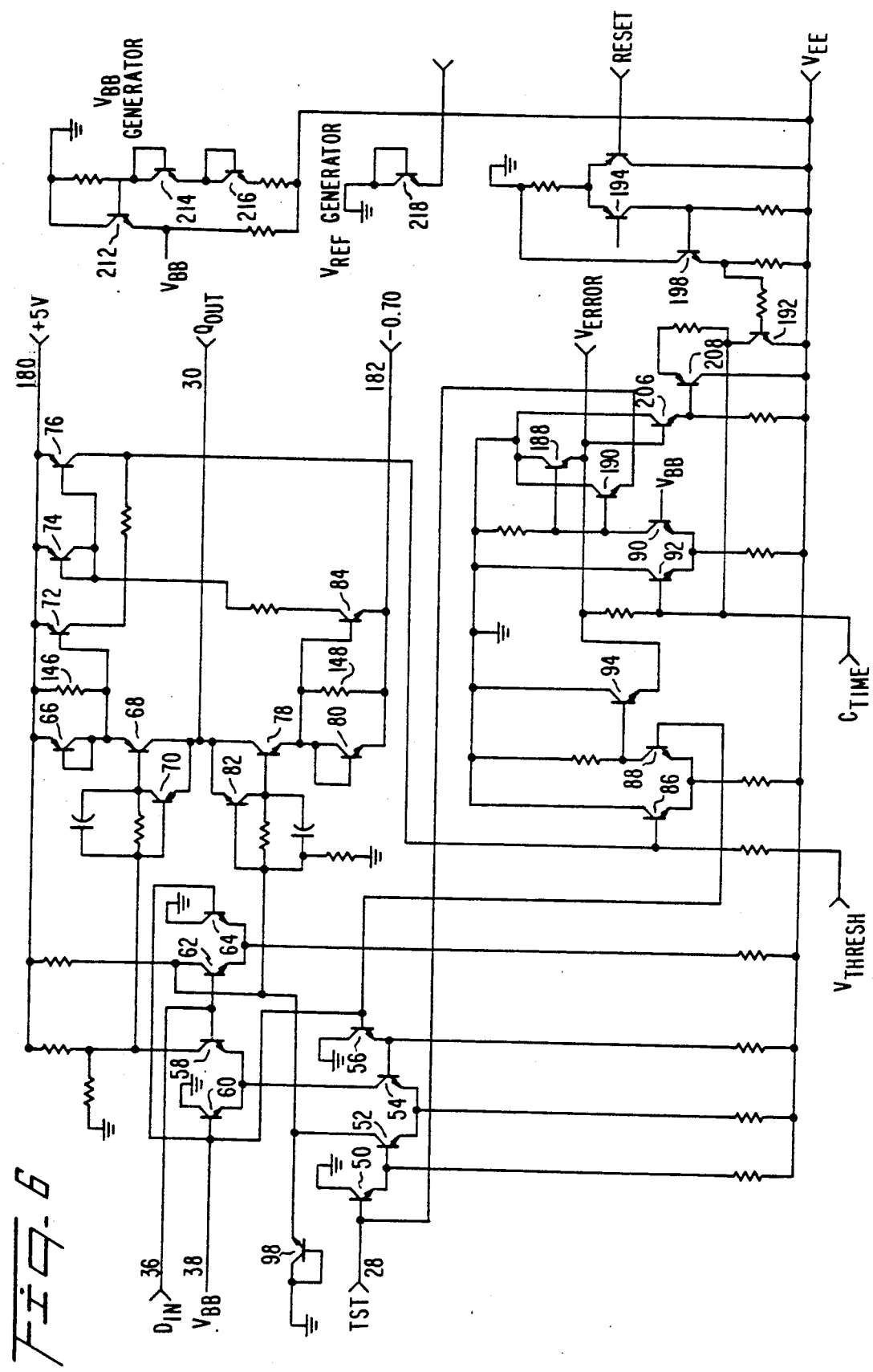
FIG. 6 is a schematic diagram showing circuit details of an alternate embodiment of the current sensing buffer with current mirrors located in the emitter circuit of the bus driver transistors.

FIG. 6 shows an alternate embodiment of a current sensing buffer according to the invention wherein current mirror circuits are provided in the emitter circuits of output transistors 68 and 78. Because the current through the emitters of 68 and 78 represents the collector current in combination with the base current, resistors 146 and 148 are used to partially bypass current around the respective current mirrors and thereby compensate for the additional base current.

There has been described a novel current sensing buffer for testing digital signal lines. By using current mirror circuits to detect and measure current levels supplied to and sunk from a digital signal line, the buffer circuit exhibits a very low output impedance permitting high frequency generation of test signals. Because no output resistors are used to sense current, there is less degradation of the output test signal with varying loads. Further, proper selection of current mirror ratios provides for different source and sink threshold values without adjusting the threshold input signal.

In this disclosure, there is shown and described only the preferred embodiment of the invention but, as aforementioned, it is to be understood that the invention is capable of use in various other combinations and environments and is capable of changes or modifications within the scope of the inventive concept as expressed herein.

The embodiments of the invention of which an exclusive property or privilege is claimed are defined as follows:

1. A current sensing buffer for use in testing an electrical data signal line, comprising:
   state switching means for generating signals having predetermined logic levels;
   current sensing means including a current mirror circuit for transmitting said predetermined logic level signals from said state switching means to said data signal line and for measuring current levels corresponding thereto; and
   fault detection means for comparing measured current levels measured by said current sensing means to predetermined acceptable ranges of current levels and, in response, outputting an error signal.

2. A current sensing buffer in accordance with claim 1, wherein said state switching means includes means for storing and selecting said predetermined logic levels to be generated.

3. A current sensing buffer in accordance with claim 1, further comprising tri-stating protection means responsive to said fault detection means error signal for controlling said state switching means for generating selectively (a) said predetermined logic levels and (b) a high impedance output through said current sensing means to said bus for protecting said current sensing buffer and components coupled to said data signal line.

4. A current sensing buffer for testing a digital signal line, comprising:

signal generator means for outputting test signals of predetermined logic level signals;

line driver means for supplying said predetermined logic level signals from said signal generator means to said digital signal line and for measuring corresponding current levels of said logic level signals transmitted to said digital signal line, said line driver means including a current mirror circuit for providing sample output signals corresponding to said current levels; and error detecting means for comparing said sample output signals to corresponding predetermined acceptable current level and, in response, generating an error signal.

5. The current sensing buffer of claim 4, wherein said signal generator means includes means to generate positive and negative logic level signals and wherein said current mirror circuit includes corresponding positive and negative logic level current mirror driver circuits for measuring and supplying said respective positive and negative logic level signals supplied by said signal generator means to said digital signal line.

6. The current sensing buffer according to claim 4, wherein said line driver means includes tri-stating means responsive to said error signal for selectively supplying (a) said predetermined logic levels from said signal generator means and (b) a high impedance output to said digital signal line for protecting said current sensing buffer and components coupled to said digital signal line.

* * * * *